United States Patent
Kang et al.

(10) Patent No.: US 10,439,670 B2
(45) Date of Patent: Oct. 8, 2019

(54) MULTIPLE TRANSMIT SYSTEM STRUCTURE AND MOBILE TERMINAL HAVING THE SAME

(71) Applicant: LG ELECTRONICS INC., Seoul (KR)

(72) Inventors: Younghee Kang, Seoul (KR); Inkyung Kim, Seoul (KR); Jihyuk Park, Seoul (KR); Dongsu Won, Seoul (KR); Kyungho Lim, Seoul (KR); Jaehyuk Jang, Seoul (KR); Eunbit Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/037,956

(22) Filed: Jul. 17, 2018

(65) Prior Publication Data

US 2019/0229764 A1 Jul. 25, 2019

Related U.S. Application Data

(60) Provisional application No. 62/621,589, filed on Jan. 24, 2018.

(30) Foreign Application Priority Data

Apr. 19, 2018 (KR) .................. 10-2018-0045715

(51) Int. Cl.
*H04B 1/401* (2015.01)
*H04B 1/26* (2006.01)
(Continued)

(52) U.S. Cl.
CPC .............. *H04B 1/401* (2013.01); *H03F 3/24* (2013.01); *H04B 1/26* (2013.01); *H04B 1/406* (2013.01);
(Continued)

(58) Field of Classification Search
None
See application file for complete search history.

(56) References Cited

U.S. PATENT DOCUMENTS 6,141,560 A 10/2000 Gillig et al.
6,175,747 B1 * 1/2001 Tanishima ............... H04B 1/54
455/403
(Continued)

OTHER PUBLICATIONS

PCT International Application No. PCT/KR2018/007293, International Search Report dated Nov. 27, 2018, 13 pages.

*Primary Examiner* — Mohammed Rachedine
(74) *Attorney, Agent, or Firm* — Lee, Hong, Degerman, Kang & Waimey PC

(57) ABSTRACT

A mobile terminal according to the present invention includes a first power amplifier (PA) to amplify and output a first signal of a first transceiver, a power combiner to combine a second signal of the first transceiver with a third signal of the second transceiver, a second power amplifier to amplify and output a fourth signal combined by the power combiner, and a switch to select one of a first transmission signal that is an output signal of the first power amplifier and a second transmission signal that is an output signal of the second power amplifier, wherein the first transceiver operates in a first communication system and the second transceiver operates in a second communication system, whereby a mobile terminal having improved transmission output power characteristics can be provided using the first communication system and the second communication system.

19 Claims, 9 Drawing Sheets

(51) Int. Cl.
  *H04B 1/403*   (2015.01)
  *H04W 88/06*   (2009.01)
  *H03F 3/24*    (2006.01)
(52) U.S. Cl.
  CPC ....... *H04W 88/06* (2013.01); *H03F 2200/294* (2013.01)

(56) References Cited

U.S. PATENT DOCUMENTS

| | | | |
|---|---|---|---|
| 6,188,877 B1 | 2/2001 | Boesch et al. | |
| 6,560,443 B1 | 5/2003 | Vaisanen et al. | |
| 6,643,522 B1* | 11/2003 | Young | H04B 1/005 |
| | | | 455/41.2 |
| 8,331,289 B1* | 12/2012 | Lee | H04B 1/006 |
| | | | 370/328 |
| 2006/0140573 A1 | 6/2006 | Kim | |
| 2006/0199592 A1* | 9/2006 | Bednekoff | H04B 1/18 |
| | | | 455/450 |
| 2012/0182938 A1 | 7/2012 | Mujtaba et al. | |
| 2013/0268028 A1* | 10/2013 | Trier | A61N 1/37229 |
| | | | 607/60 |
| 2014/0266866 A1* | 9/2014 | Swirhun | G01S 7/026 |
| | | | 342/188 |

* cited by examiner (a)

(b)

(a)

(b)

MULTIPLE TRANSMIT SYSTEM STRUCTURE AND MOBILE TERMINAL HAVING THE SAME

CROSS-REFERENCE TO RELATED APPLICATION

Pursuant to 35 USC § 119, this application claims the benefit of earlier filing date and right of priority to U.S. Provisional Application No. 62/621,589, filed Jan. 24, 2018, and also claims the benefit to Korean Application No. 10-2018-0045715, filed on Apr. 19, 2018, the contents of which are all incorporated by reference herein in their entirety.

BACKGROUND OF THE DISCLOSURE

1. Field of the Invention

The present invention relates to a multiple transmit system structure and a mobile terminal having the same, and more particularly, to a multiple communication system structure and a mobile terminal having the same.

2. Background of the Disclosure

Terminals may be divided into mobile/portable terminals and stationary terminals according to mobility. Also, the mobile terminals may be classified into handheld types and vehicle mount types according to whether or not a user can directly carry.

Mobile terminals have become increasingly more functional. Examples of such functions include data and voice communications, capturing images and video via a camera, recording audio, playing music files via a speaker system, and displaying images and video on a display unit. Some mobile terminals include additional functionality which supports electronic game playing, while other terminals are configured as multimedia players. Specifically, in recent time, mobile terminals can receive broadcast and multicast signals to allow viewing of video or television programs As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

In addition to those attempts, the mobile terminals provide various services in recent years by virtue of commercialization of wireless communication systems using a Long-Term Evolution (LTE) communication technology. In the future, it is expected that a wireless communication system using a Fifth Generation (5G) communication technology will be commercialized to provide various services. Meanwhile, some of LTE frequency bands may be allocated to provide 5G communication services.

In this regard, when a plurality of communication systems uses sub-frequency bands adjacent to the same frequency band, it is necessary to transmit signals using any one of a plurality of transmitting units. At this time, an LTE communication system may transmit a first signal through a first power amplifier and a first antenna. Or, a 5G communication system may transmit a second signal through a second power amplifier and a second antenna.

In this case, an antenna performance of the first antenna or the second antenna may be degraded in a low frequency band. For example, there is a problem that the performance of the first antenna or the second antenna is degraded in a low frequency band, that is, in a band of 600 to 900 MHz.

Therefore, in order to compensate for the antenna performance degradation in this low frequency band, the LTE communication system or the 5G communication system needs to increase TX output power. However, there is a problem that the output characteristic is degraded when the first power amplifier or the second power amplifier of the LTE communication system or the 5G communication system outputs a power value exceeding a threshold TX output power value. For example, when an output power value exceeding the threshold TX output power is output, there is a problem that the output power value is saturated.

Further, when a plurality of power amplifiers, that is, the first power amplifier and the second power amplifier, are provided with individual power supply units, a power supply control according to operations of the plurality of power amplifiers is complicated.

Also, when the 5G communication system uses a high sub-frequency band within the same frequency band, there is a problem that a loss due to a path from an output of the second power amplifier to the antenna increases.

In addition, when a signal is transmitted only by the LTE communication system, there is a problem that a loss due to a path from an output of the first power amplifier to the antenna increases. Accordingly, it is difficult to reach actually required transmission power only by the LTE communication system which is a first communication system.

SUMMARY OF THE DISCLOSURE

The present invention is directed to solving the aforementioned problems and other drawbacks. Another aspect of the present invention is to provide a mobile terminal with improved transmission output power characteristics by use of a first communication system and a second communication system.

Another aspect of the present invention is to provide a mobile terminal with improved low-noise characteristics by use of a first communication system and a second communication system.

According to an aspect of the present invention to achieve the above objects and other advantages, there is provided a mobile terminal according to the present invention, including a first power amplifier (PA) to amplify and output a first signal of a first transceiver, a power combiner to combine a second signal of the first transceiver with a third signal of the second transceiver, a second power amplifier to amplify and output a fourth signal combined by the power combiner, and a switch to select one of a first transmission signal that is an output signal of the first power amplifier and a second transmission signal that is an output signal of the second power amplifier, wherein the first transceiver operates in a first communication system and the second transceiver operates in a second communication system, whereby a mobile terminal having improved transmission output power characteristics can be provided using the first communication system and the second communication system.

In one embodiment, the first communication system may be an LTE system and the second communication system may be a 5G (generation) communication system. The first and second communication systems may use the same frequency band.

In one embodiment, the mobile terminal may further include one antenna connected to the switch to transmit a transmission signal as one of the first transmission signal and the second transmission signal to a base station or another mobile terminal. At this time, the first transmission signal of the first communication system and the second transmission signal of the second communication system may both be transmitted through the one antenna.

In one embodiment, the mobile terminal may further include a duplexer disposed between the switch and the antenna to separate the transmission signal from a reception signal from the base station or the another mobile terminal. At this time, the duplexer may be connected to the switch through a transmission path and connected to a low-noise amplifier (LNA) through a reception path. Also, the low-noise amplifier may be configured to amplify a first reception signal of the first communication system and a second reception signal of the second communication system.

In one embodiment, the mobile terminal may further include a distributor connected to the low-noise amplifier to distribute the amplified first or second reception signal into an input of the first transceiver and an input of the second transceiver. The mobile terminal may further include a second low-noise amplifier disposed between the distributor and the first transceiver to amplify a distributed first reception path signal. The mobile terminal may further include a third low-noise amplifier disposed between the distributor and the second transceiver to amplify a distributed second reception path signal.

In one embodiment, when the switch is connected to an output of the first power amplifier, the switch connection may be synchronized with that the first signal of the first transceiver is selected. Also, when the switch is connected to an output of the second power amplifier, the switch connection may be synchronized with that the second signal of the first transceiver is selected.

In one embodiment, the first signal may be transmitted through a first port of the first transceiver when the first transceiver transmits the first signal. In addition, the second signal may be transmitted through a second port of the first transceiver when the first transceiver and the second transceiver simultaneously transmit the second signal and the third signal. Also, a separation between the first port and the second port may be performed by one modulator and a switch within the first transceiver when the first port or the second port is selected in the first transceiver. Alternatively, the separation between the first port and the second port may be performed by separated modulators within the first transceiver.

In one embodiment, a power supply to the second power amplifier may be carried out by a first modem connected to the first transceiver. A control of supplying power to the second power amplifier may be carried out by a second modem connected to the second transceiver. Alternatively, the control of supplying power to the second power amplifier may be carried out by a first modem and a second modem connected to the first transceiver and the second transceiver, respectively.

In one embodiment, the mobile terminal may further include a controller to control operations of the first transceiver and the second transceiver. At this time, the controller may control the first transceiver and the second transceiver to operate when a reference signal (RS) of the first communication system is less than a threshold value. In addition, the control unit may control the switch to select the second transmission signal.

In one embodiment, the mobile terminal may further include a controller to control operations of the first transceiver and the second transceiver. At this time, the controller may control the first transceiver to operate and the second transceiver not to operate when a first reference signal of the first communication system is more than a first threshold value and a second reference signal of the second communication system is less than a second threshold value. In addition, the controller may control the switch to select the first transmission signal.

In one embodiment, the mobile terminal may further include a controller to control operations of the first transceiver and the second transceiver. In this case, the controller may control both the first transceiver and the second transceiver to operate when the reference signal received by the first transceiver through the second low-noise amplifier is more than a threshold value. In addition, the control unit may control the switch to select the second transmission signal. Or, the controller may control the first transceiver to operate and the second transceiver not to operate when the first reference signal received by the first transceiver through the second low-noise amplifier is more than a first threshold value and the second reference signal received by the second transceiver through the third low-noise amplifier is less than a second threshold value. In addition, the controller may control the switch to select the first transmission signal.

In one embodiment, the mobile terminal may further include a controller to control operations of the first transceiver and the second transceiver. The controller may retransmit a first request through the first communication system and the second communication system when the first request is transmitted through the first communication system and a reception of a first response to the first request from a base station or another mobile terminal is failed. Further, the first transceiver and the second transceiver may both operate during a time interval including a time duration and a time margin for the retransmission, and the switch may be controlled to select a second transmission signal on a second path.

According to another aspect of the present invention, there is provided a mobile terminal, including a power combiner to combine a second signal with a third signal among a first signal and the second signal of the first transceiver and the third signal of the second transceiver so as to output a fourth signal, or combine one of the first signal and the second signal with the third signal, a switch to select one of the first signal and the fourth signal or one of the first signal and the second signal, and one power amplifier to amplify and output at least one of the first to third signals. The first transceiver may operate in a first communication system and the second transceiver may operate in a second communication system.

In one embodiment, the power combiner may be configured to combine the second signal with the third signal to output the fourth signal. Also, the switch may be configured to select one of the first signal and the fourth signal. The one power amplifier may be configured to amplify and output the first signal and the fourth signal. In addition, an output of the power combiner may be provided to one of two switch ports of the switch.

In one embodiment, the switch may be configured to select one of the first signal and the second signal. In addition, the power combiner may be configured to combine one of the first signal and the second signal with the third signal. In addition, the one power amplifier may be configured to amplify and output the first to third signals. In addition, one of inputs of the power combiner may be connected to one output port of the switch.

In one embodiment, the first transceiver operating in the first communication system and the second transceiver operating in the second communication system may be configured as an integrated transceiver. At this time, the integrated transceiver may include a first transmission port, a second transmission port and a reception port of the first communication system, and a transmission port and a reception port of the second communication system.

In one embodiment, the first transceiver operating in the first communication system and the second transceiver operating in the second communication system may be configured as an integrated transceiver. At this time, the switch may be implemented within the integrated transceiver and the integrated transceiver may be interfaced with the power amplifier through one port.

According to still another aspect of the present invention, there is provided a mobile terminal, including a first low-noise amplifier to low-noise-amplify a first reception signal of a first communication system and a second reception signal of a second communication system, a second low-noise amplifier to low-noise-amplify a third reception signal of the second communication system and a fourth reception signal of the second communication system, a first distributor connected to the first low-noise amplifier to distribute the amplified first or second reception signal into an input of a first transceiver and an input of a second transceiver, and a second distributor connected to the second low-noise amplifier to distribute the amplified third or fourth reception signal into the input of the first transceiver and the input of the second transceiver.

In one embodiment, the mobile terminal may further include a first receiving amplifier to amplify a signal distributed from the first distributor and output the amplified signal to the first transceiver, a second receiving amplifier to amplify the signal distributed from the first distributor and output the amplified signal to the second transceiver, a third receiving amplifier to amplify a signal distributed from the second distributor and output the amplified signal to the first transceiver, and a fourth receiving amplifier to amplify the signal distributed from the second distributor and output the amplified signal to the second transceiver.

In one embodiment, the first distributor may simultaneously provide the first reception signal and the second reception signal of a first frequency band to the first receiving amplifier and the second receiving amplifier, respectively, and the second distributor may simultaneously provide the third reception signal and the fourth reception signal of a second frequency band to the third receiving amplifier and the fourth receiving amplifier, respectively. At this time, an intra carrier aggregation (intra-CA) may be performed through the first frequency band and the second frequency band. In addition, first information and third information included in the first reception signal and the third reception signal may include first control information for each sub frame, and third information and fourth information included in the second reception signal and the fourth reception signal may include second control information for each slot.

In one embodiment, the first low-noise amplifier may be connected to a first antenna through a first duplexer, and the second low-noise amplifier may be connected to a second antenna through a second duplexer. The first antenna may simultaneously receive the first reception signal and the second reception signal of a first frequency band, and the second antenna may simultaneously receive the third reception signal and the fourth reception signal of a second frequency band. At this time, the first transceiver and the second transceiver may simultaneously acquire first to fourth information included in the first to fourth reception signals.

Effects of the Disclosure

Effects of a mobile terminal, a transmitting unit including a power amplifier and a switch, and a receiving unit having a low-noise amplifier and a distributor according to the present invention will be described as follows.

According to at least one embodiment of the present invention, a mobile terminal having a transmitting unit capable of selectively transmitting a signal of a second communication system while transmitting a signal of a first communication system can be provided, thereby improving transmission output characteristics.

Also, according to at least one embodiment of the present invention, a mobile terminal having improved transmission output power characteristics can be provided by providing a transmitting unit employing a 5G signal transmission scheme as well as an LTE signal transmission scheme in an LTE re-farming system.

In addition, according to at least one embodiment of the present invention, a mobile terminal having improved low-noise characteristics can be provided by employing a receiving unit supporting a 5G signal receiving scheme as well as an LTE signal receiving scheme in an LTE re-farming system.

Further, according to at least one of the embodiments of the present invention, an LTE/5G communication service can be provided by receiving an LTE/5G signal through a single receiving unit, and communication services in the LTE/5G system or between those systems can be flexibly provided through a plurality of receiving units.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

DETAILED DESCRIPTION OF THE DISCLOSURE

Figure 1A:
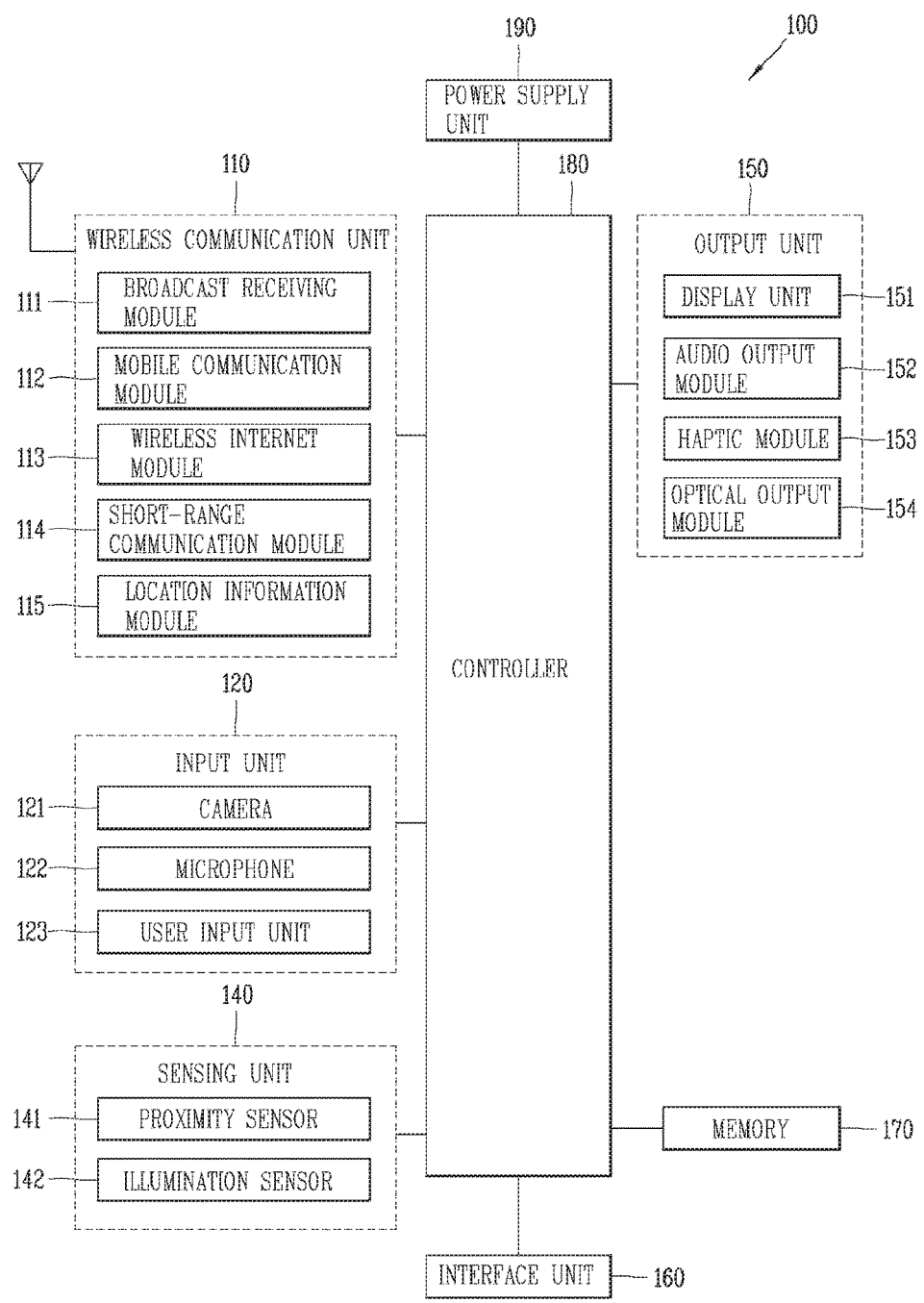
FIG. 1A is a block diagram of a mobile terminal in accordance with one exemplary embodiment of the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
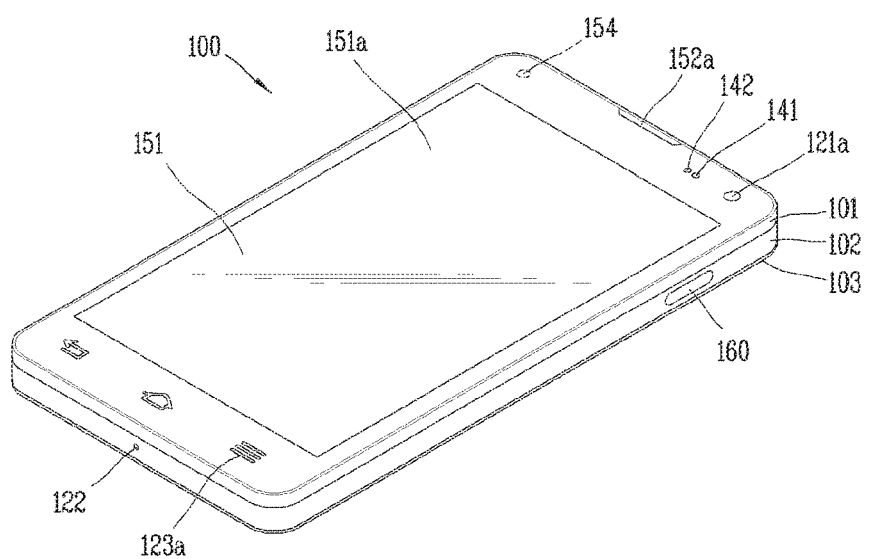
FIGS. 1B and 1C are conceptual views illustrating one example of a mobile terminal according to the present invention, viewed from different directions.
Figure 1C:
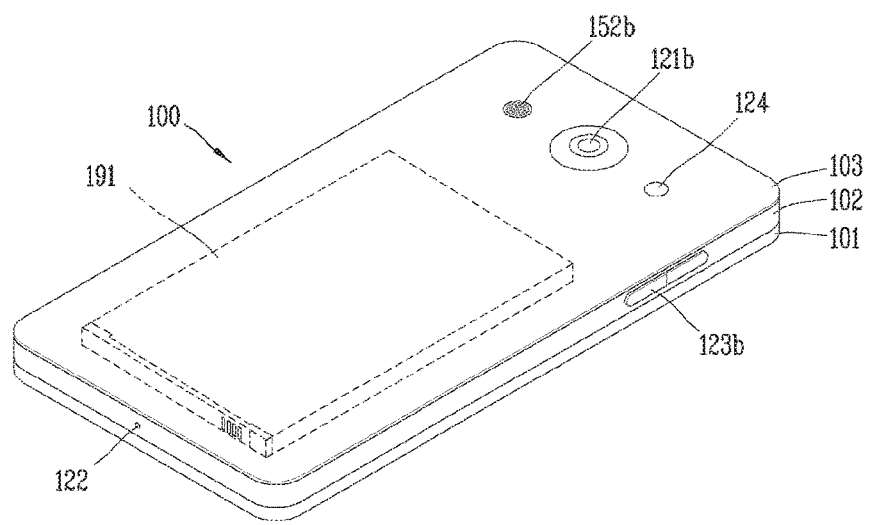

Referring to FIGS. 1A to 1C, FIG. 1A is a block diagram of a mobile terminal in accordance with one exemplary embodiment of the present invention, and FIGS. 1B and 1C are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The modem 180 typically functions to control an overall operation of the mobile terminal 100, in addition to the operations associated with the application programs. The modem 180 may provide or process information or functions appropriate for a user by processing signals, data, information and the like, which are input or output by the aforementioned various components, or activating application programs stored in the memory 170.

Also, the modem 180 may control at least some of the components illustrated in FIG. 1A, to execute an application program that has been stored in the memory 170. In addition, the modem 180 may control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Referring to FIGS. 1B and 1C, the disclosed mobile terminal 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may not be located on the front surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a modem 180 may generate a control command corresponding to the touch. Contents input in the touch manner may be characters, numbers, instructions in various modes, or a menu item that can be specified.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include sound holes for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the modem 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

The drawings are illustrated on the basis that the first manipulation unit 123a is a touch key, but the present invention may not be necessarily limited to this. For example, the first manipulation unit 123a may be configured as a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

As described above, with respect to the wireless communication unit 110, that is, the mobile communication module 111 and the wireless Internet module 112, a multiple transmit system structure and a mobile terminal 100 having the multiple transmit system structure will be described below. Here, in the multiple transmit system structure, that is, in a multiple communication system structure, at least one power amplifier in the wireless communication unit 110 interacts with the controller 180 that manages itself and the power supply unit 190.

Hereinafter, description will be given of embodiments of a multiple transmit system structure and a mobile terminal having the same with reference to the accompanying drawings. It will be apparent to those skilled in the art that the present invention may be embodied in other specific forms without departing from the spirit or essential characteristics thereof.

Figure 2:
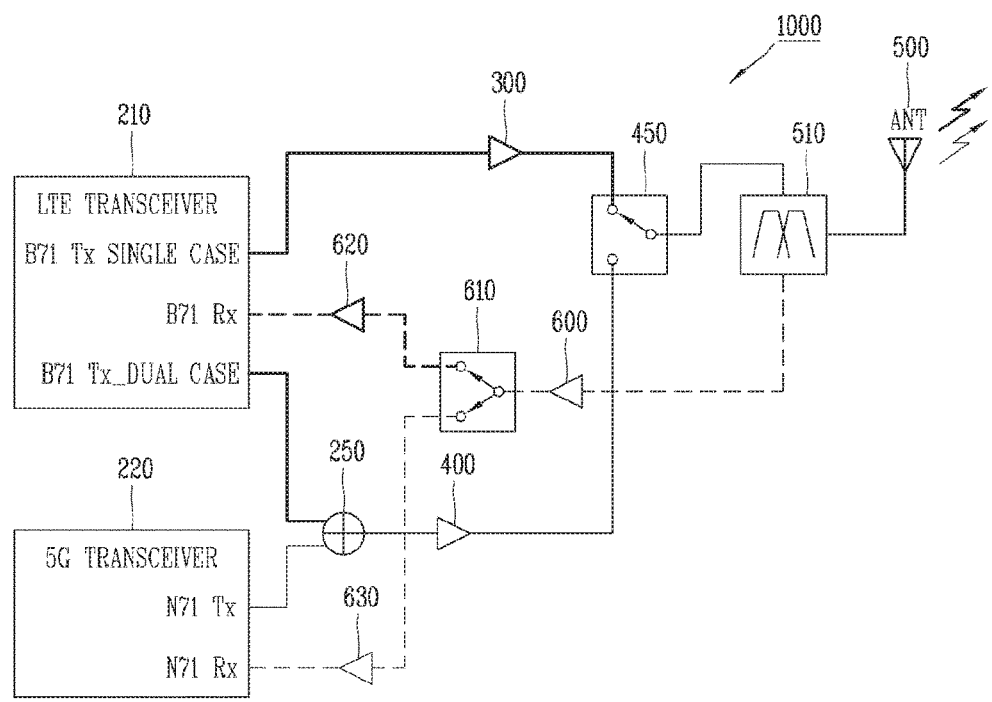
FIG. 2 is a view illustrating a transceiver having a dual power amplifier and a mobile terminal having the transceiver according to the present invention.
Figure 2:
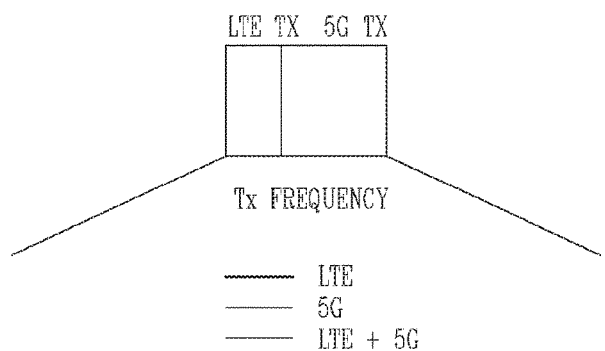

FIG. 2 is a view illustrating a transceiver having a dual power amplifier and a mobile terminal having the transceiver according to the present invention. Referring to FIG. 2, a mobile terminal 1000 includes a first transceiver 210, a second transceiver 220, a power combiner 250, a first power amplifier (PA) 300, a second power amplifier 400, and a switch 450. The mobile terminal 1000 may further include a controller (or a modem) 180, an antenna 500, a duplexer 510, a low-noise amplifier (LNA) 600, a distributor (or a divider) 610, a second low-noise amplifier 620, and a third low-noise amplifier 630.

The first transceiver 210 operates in a first communication system and provides a first signal to the first power amplifier 300. The second transceiver 220 operates in a second communication system and provides a second signal to the second power amplifier 400. At this time, the first communication system may be an LTE system, and the second communication system may be a 5G (generation) communication system. Here, the 5G communication system may be an LTE re-farming system that reuses some frequencies within the LTE system.

On the other hand, in the 5G system associated with the LTE re-farming system, a frequency band of the second communication system may be the same frequency band as a frequency band of the first communication system. Here, the term "the same frequency band" may refer to that respective sub-frequency bands within "the same frequency band" are adjacent to each other, as illustrated in (b) of FIG. 2. Alternatively, the term may refer to that at least some of respective frequency bands within "the same frequency band" overlap each other. Meanwhile, the aforementioned 5G communication system is not limited only to the LTE re-farming system but may also extend to a 5G system of a 3.5 GHz band depending on applications.

The first transceiver 210 may have at least three ports, which may include two transmission ports and one reception port. Here, the two transmission ports include a first transmission port for operating the first communication system alone and a second transmission port for operating the first communication system in cooperation with the second communication system. On the other hand, the one reception port is a reception port for receiving a reception signal of the first communication system.

The first power amplifier 300 is configured to amplify a first signal of the first transceiver 210 and output the amplified first signal along a first path. The power combiner 250 is configured to combine a second signal of the first transceiver 210 with a third signal of the second transceiver 220.

The second power amplifier 400 is configured to amplify and output a fourth signal combined by the power combiner 250. As described above, as the signals of the first and second communication systems are combined by the power combiner 250 disposed before the second power amplifier 400, the following advantages are obtained. First, a loss may increase when signals are combined after the second power amplifier 400, but the increase in the loss is not caused when the signals are combined before the second power amplifier 400. In other words, a plurality of signal can be amplified using only one power amplifier. That is, the second power amplifier 400 amplifies the second signal of the first transceiver 210 and the third signal of the second transceiver 220 and the amplified signals are combined for output. At this time, the power combiner 250 combines the second signal with the third signal and provides the combined signal to the second power amplifier 400.

Here, an output signal of the first power amplifier 300 may be referred to as a first transmission signal and an output signal of the second power amplifier 400 may be referred to as a second transmission signal. The switch 450 is configured to select one of the first transmission signal as the output signal of the first power amplifier 300 and the second transmission signal as the output signal of the second power amplifier 400. In this case, the switch 450 may be a single pole double throw (SPDT) switch that provides the selected one of the first transmission signal and the second transmission signal to the duplexer 510.

A connection state of the switch 450 may be controlled to control a signal transmitted from the mobile terminal 1000. This control of the connection state of the switch 450 may be performed by the first transceiver 210 or by the modem 180. That is, the modem 180 may control the first power amplifier 300 to transmit the first transmission signal of the first communication system or control the second power amplifier 400 to transmit the second transmission signals of the first and second communication systems.

The antenna 500 is connected to the switch 450 to transmit the transmission signal, which is one of the first transmission signal and the second transmission signal, to a base station or another mobile terminal. At this time, the antenna 500 may be configured to operate in frequency bands of the first communication system and the second communication system, and is one single antenna. Therefore, the first transmission signal of the first communication system and the second transmission signal of the second communication system can all be transmitted through the one antenna 500.

On the other hand, when the second communication system operates in a millimeter wave band of 3.5 GHz or more and the terminal also supports an array antenna, a separate antenna operating in the second communication system may be arranged.

The duplexer 510 is disposed between the switch 450 and the antenna 500 and is configured to separate the transmission signal from a reception signal from a base station or another mobile terminal. In this regard, the duplexer 510 is used when the mobile terminal 1000 transmits/receives signals through frequency division duplex (FDD). On the other hand, a transmission/reception switch (not illustrated) may be used when the mobile terminal 1000 transmits/receives signals through time division duplex (TDD). At this time, the duplexer 510 may be replaced with the transmission/reception switch (not illustrated).

Meanwhile, the duplexer may be connected to the switch 450 through a transmission path and connected to the low-noise amplifier 600 through a reception path. The low-noise amplifier 600 is configured to amplify a first reception signal of the first communication system and a second reception signal of the second communication system. In this regard, the low-noise amplifier 600 may low-noise-amplify a first reception signal of a first frequency band and a second reception signal of a second frequency band. At this time, the first and second frequency bands may be adjacent to each other as illustrated in (b) of FIG. 2.

Meanwhile, the modem 180 may control the low-noise amplifier 600 or the first and second transceivers 210 and 220 according to the reception signal as well as the transmission signal. In this regard, the modem 180 may control the low-noise amplifier 600 to optimize a low-noise characteristic in a frequency band in which a reception signal is included. That is, when the first reception signal of the first communication system is received, the modem 180 may control the low-noise amplifier 600 to optimize the low-noise characteristic in the first frequency band. On the other hand, when the second reception signal of the second communication system is received, the modem 180 may control the low-noise amplifier 600 to optimize the low noise characteristic in the second frequency band. Meanwhile, when both the first and second reception signals are received, the modem 180 may control the low-noise amplifier 600 to optimize the low-noise characteristic in the second frequency band. In this regard, it is more advantageous in terms of performance of the overall communication system to optimize the low-noise characteristic in the second frequency band, which is a higher frequency band.

Meanwhile, since the low-noise amplifier 600 is designed for low-noise characteristics rather than a gain itself, an additional low-noise amplifier is needed in order to effectively decode a reception signal. In this regard, the distributor 610 is connected to the low-noise amplifier 600 and distributes (divides or splits) the amplified first reception signal or the amplified second reception signal into an input of the first transceiver 210 and an input of the second transceiver 220.

On the other hand, the distributor 610 distributes the reception signal at a predetermined distribution ratio, for example, 3 dB. At this time, if the distributor 610 is located at the front end of the low-noise amplifier 600, a size of the reception signal is reduced. Thus, as illustrated in FIG. 2, the distributor 610 is preferably located at the rear end of the low-noise amplifier 600 and distributes the first and second reception signals amplified by the low-noise amplifier 600.

At this time, the second low-noise amplifier 620 is disposed between the distributor 610 and the first transceiver 210 and is configured to amplify a reception signal on a first path. On the other hand, the third low-noise amplifier 630 is disposed between the distributor 610 and the second transceiver 220 and is configured to amplify a reception signal on a second path. Here, the reception signal on the first path is a signal that the sum of the first reception signal and the second reception signal is distributed to the first path by the distributor 610. Also, the reception signal on the second path is a signal that the sum of the first reception signal and the second reception signal is distributed to the second path by the distributor 610. That is, the second low-noise amplifier 620 is configured to amplify a first reception path signal distributed by the distributor 610. On the other hand, the third low-noise amplifier 630 is configured to amplify a second reception path signal distributed by the distributor 610.

Hereinafter, a control operation of selectively transmitting one of a first transmission signal and a second transmission signal will be described in detail. In this regard, a state in which signal transmission/reception is performed using both the first and second communication systems is referred to as a dual connectivity (DC) state. Thus, a control operation of transmitting/receiving signals using both the first and second communication systems may be referred to as a DC operation. On the other hand, a control operation of transmitting/receiving signals using only the first communication system in the DC state may be referred to as a DC release operation.

In this regard, the modem 180 may control the operations of the first transceiver 210 and the second transceiver 220. Specifically, the modem 180 may control the operations of the first transceiver 210 and the second transceiver 220 such that either the first transmission signal or the second transmission signal is transmitted. Alternatively, the modem 180 may control the operations of the first power amplifier 300 and the second power amplifier 400 so that either the first transmission signal or the second transmission signal is transmitted.

For this DC (or DC release) operation, the modem 180 may use a reference signal (RS) transmitted from the base station. If the reference signal of the first communication system is less than a threshold value, the modem 180 may control both the first transceiver 210 and the second transceiver 220 to operate together. In addition, the modem 180 may control the switch 450 to select the second transmission signal on the second path. Since a reception performance by the first communication system is not good, signals can be transmitted using all of the first and second communication systems under assumption that a transmission link has a similar performance to that of a reception link. On the other hand, signals may be transmitted using all of the first and second communication systems according to importance such as priority of transmitted information. That is, a packet requiring a low-latency characteristic or a response to such a packet may be transmitted using all of the first and second communication systems. Alternatively, a control information packet or a response to such a packet may be transmitted using all of the first and second communication systems.

On the other hand, if a first reference signal of the first communication system is more than a first threshold value and a second reference signal of the second communication system is less than a second threshold value, the modem 180 operates as follows. That is, the modem 180 may control the first transceiver 210 to operate and the second transceiver 220 not to operate. In addition, the modem 180 may control the transmission switch to select the first transmission signal on the first path. Since the reception performance by the first communication system is good but the reception performance by the second communication system is not good, signals can be transmitted using only the first communication system under assumption that the transmission link has the similar performance to that of the reception link.

On the other hand, if the first reference signal of the first communication system is more than the first threshold value and the second reference signal of the second communication system is more than the second threshold value, the modem 180 operates as follows. That is, the modem 180 may reduce outputs P1 and P2 of the first power amplifier 100 and the second power amplifier 200 while controlling the first transceiver 210 and the second transceiver 220 to operate together. In this regard, a back-off level of P1 may be decided in proportion to a difference between the first reference signal and the first threshold value. Further, a back-off level of P2 may be decided in proportion to a difference between the second reference signal and the second threshold value. At this time, the modem 180 may control the transmission switch to select the second transmission signal on the second path. Since the reception performance by the first and second communication systems is good, signals can be transmitted using all of the first and second communication systems under assumption that the transmission link has the similar performance to that of the reception link. However, since all of the transmission links are good, it is possible to transmit signals by reducing the output level.

Hereinafter, for the aforementioned DC (or DC release) operation, a detailed operation of a receiving unit as well as the operation of the modem 180 will be described.

If a reference signal received by the first transceiver 210 through the second low-noise amplifier 620 is more than a threshold value, the modem 180 operates as follows. In this regard, the reference signal and the threshold value may be the first reference signal and the first threshold value, as described above. At this time, the modem 180 may control both the first transceiver 210 and the second transceiver 220 to operate, and control the switch 450 to select the second transmission signal on the second path.

Meanwhile, if the first reference signal received by the first transceiver 210 through the second low-noise amplifier 620 is more than the first threshold value and the first reference signal received by the second transceiver 220 through the third low-noise amplifier 630 is less than the second threshold value, the modem 180 operates as follows. At this time, the modem 180 may control the first transceiver 210 to operate and the second transceiver 220 not to operate, and control the switch 450 to select the first transmission signal on the first path.

Although the modem 180 is described as performing the DC (or DC release) operation, the present invention is not limited thereto, and the corresponding operation may alternatively be performed by combination of the modem 180 and the first and second transceivers 210 and 220. For example, the modem 180 may control the first transceiver 210 to operate and the second transceiver 220 not to operate, and the first transceiver 210 may control the switch 450 to select the first transmission signal on the first path. At this time, the modem 180 and the first and second transceivers 210 and 220 may also be collectively referred to as a controller.

Meanwhile, when the first reference signal received by the first transceiver 210 through the second low-noise amplifier 620 is more than the first threshold value and the second reference signal received by the second transceiver 220 through the third low-noise amplifier 630 is more than the second threshold value, the modem 180 operates as follows. At this time, the modem 180 may control both the first transceiver 210 and the second transceiver 220 to operate, and control the switch 450 to select the second transmission signal on the second path. Meanwhile, the modem 180 may decide the back-off level of P1 in proportion to the difference between the first reference signal and the first threshold value. Also, the modem 180 may decide the back-off level of P2 in proportion to the difference between the second reference signal and the second threshold value. Accordingly, the modem 180 can control the outputs P1 and P2 of the first power amplifier 300 and the second power amplifier 200 according to the back-off levels of P1 and P2.

On the other hand, as described above, the modem 180 may control the DC (or DC release) operation depending on importance, such as priority of transmitted information and the like. For example, the following operation may be performed on the assumption that information to be retransmitted has higher priority than other information. That is, if a first request is transmitted through the first communication system and a reception of a first response to the first request from the base station or another mobile terminal is failed, the modem 180 operates as follows. At this time, the modem 180 retransmits the first request through all of the first communication system and the second communication system. That is, regardless of performance of a current transmission/reception link, a retransmission packet is transmitted in the DC state so as to enhance possibility of success in receiving the packet at the time of the retransmission. To this end, the modem 180 controls both the first transceiver 210 and the second transceiver 220 to operate during a time interval including a time duration for retransmission. At this time, the second transceiver 220 and the second power amplifier 300 should be in an "ON" state during a transition time for the operation of the second power amplifier 300 and the retransmission time duration. In addition, the modem 180 controls the switch 450 to select the second transmission signal on the second path.

Hereinafter, a synchronization between a switch selection and a transceiver and a separation between ports in response to a signal transmission of the transceiver will be described.

Regarding the synchronization between the switch selection and the transceiver, when the switch 450 is connected to an output of the first power amplifier 300, it is synchronized with that the first signal of the first transceiver 210 is selected. Also, when the switch is connected to an output of the second power amplifier 400, it is synchronized with that the second signal (or the second and third signals) of the first transceiver 210, 220 is selected. In this case, the selection of the first signal or the second signal (or the second and third signals) may first be carried out in consideration of a settling time of the first and second power amplifiers 300 and 400. Alternatively, when the switch 450 is connected to the outputs of the first and second power amplifiers 300 and 400, it may be synchronized exactly with that the signals of the first and second transceivers 300 and 400 are selected. However, considering the settling time of the first and second power amplifiers 300 and 400, the operation that first information or second information is included in the first signal or the second signal (or the second and third signal) may be carried out after the settling time.

Regarding the separation between ports in response to the signal transmission, when the first transceiver 210 transmits a first signal, the first signal is transmitted through a first port of the first transceiver 210. On the other hand, when the first transceiver 210 and the second transceiver 220 simultaneously transmit a second signal and a third signal, the second signal is transmitted through a second port of the first transceiver 210. Here, the first port is a port for a single signal transmission of the first communication system (e.g., the LTE communication system) and the second port is a port for a dual signal transmission of the first communication system (e.g., the LTE communication system).

In this case, when the first port or the second port is selected in the first transceiver 210, the separation between the first port and the second port may be carried out by one modulator and the switch within the first transceiver 210 or separated modulators within the first transceiver. Alternatively, the separation between the first port and the second port may be performed by the modem 180. Alternatively, the separation between the first port and the second port may be performed by a first modem 181 that controls the first transceiver 210. Here, the first modem 181 controls the operation of the first transceiver 210 and a second modem 182 controls the operation of the second transceiver 220. Meanwhile, the first modem 181 and the second modem 182 may be physically separated modems, or may correspond to a module which is physically configured as one member but functionally separated.

Hereinafter, an operation of supplying power to and controlling a power amplifier and a control operation thereof will be described in detail.

In this regard, the power supply to the first power amplifier 300 and the second power amplifier 400 may be performed by a power supply unit. At this time, the power supply unit may be controlled by the first and second transceivers 210 and 220 or may be controlled by the first and second modems 181 and 182.

In this regard, the power supply to the first power amplifier 300 may be performed by the first modem 181 connected to the first transceiver 210. The power supply to the second power amplifier 400, on the other hand, may be performed by the first modem 181 connected to the first transceiver 210 or by the second modem 182 connected to the second transceiver 220. In this case, when the power supply is carried out by the first modem 181, there is an advantage that the power supply is integrally performed by a single modem. On the other hand, when the power supply is carried out by the second modem 182, there is an advantage that not only the power supply but also a power management/control regarding whether or not power is appropriately supplied to the second power amplifier 400 are facilitated.

The control of supplying power to the first power amplifier 300 and the second power amplifier 400 may be performed by the first transceiver 210 and the second transceiver 210 without a control operation by the first modem 181 and the second modem 182. However, the mobile terminal 100 needs to perform a power control of an RF signal and accordingly a power management unit and the modem 180 need to control the power supply. Therefore, even if the first transceiver 210 and the second transceiver 220 perform the control of supplying power to the first power amplifier 300 and the second power amplifier 400, the power supply control is preferably performed by the first modem 181 and the second modem 182.

The operation of controlling the first power amplifier 300 and the second power amplifier 400 may include an input/output matching control, an output power control, and the like. The first power amplifier 300 and the second power amplifier 400 may perform the input/output matching control using a variable element for a wide band operation. At this time, the input/output matching control for the first power amplifier 300 and the second power amplifier 400 may be performed by the first transceiver 210 and the second transceiver 220. Alternatively, the input/output matching control for the first power amplifier 300 and the second power amplifier 400 may be performed by the first modem 181 and the second modem 182. In this regard, the input/output matching control by the first modem 181 and the second modem 182 is more preferable in view of the overall system characteristics.

Meanwhile, the output power control for the first power amplifier 300 and the second power amplifier 400 may be performed by the first transceiver 210 and the second transceiver 220. In this regard, the output power control for the first power amplifier 300 and the second power amplifier 400 may be performed by the first modem 181 connected to the first transceiver 210. As described above, since the output power control is always performed by the first modem 181, there is an advantage that the output power control before/after switching is facilitated.

Alternatively, the output power control for the first power amplifier 300 and the second power amplifier 400 may be performed by the first modem 181 and the second modem 182, respectively. As the output power control is performed by the first modem 181 and the second modem 182, respectively, an optimal output power control as well as an optimal communication scheme can be decided (performed, selected) by reflecting current communication performances (i.e., link characteristics) of the first and second communication systems.

Hereinafter, a main configuration of a selective transmission scheme through the first communication system or the first and second communication systems in FIG. 2 will be summarized. For example, the first and second communication systems may be the LTE (communication) system and the 5G (communication) system, respectively.

According to the present invention, when power is transmitted using combination of the LTE and 5G systems (LTE+5G), a switch is disposed between a power amplifier and a duplexer while maintaining necessary components for power transmission using only the LTE system.

In addition, the LTE transceiver has a configuration in which the transmission of only an LTE signal and the transmission of both LTE and 5G signals (LTE+5G) are performed in a distinguishing manner.

When the LTE and 5G signals (LTE+5G) are transmitted, the LTE transceiver inputs the sum of the two input signals to a common power amplifier (PA).

In addition, a switch for selecting one of the two power amplifiers (PAs) is provided at a front end of an input of a duplexer so as to be synchronized with a case where an LTE transceiver or a 5G transceiver transmits a corresponding signal.

On the other hand, when only the first transceiver 210, that is, the LTE transceiver operates, the following characteristics are provided. This case is similar to a state in which there is no special restriction on an existing LTE operation. However, a path is selected through the switch 450 at the rear end of the first power amplifier 300. With respect to the transmission in the LTE transceiver, the transmission takes place via an existing modulator which transmits the LTE signal. That is, when the first transmission signal is transmitted through the first transceiver 210 and the first power amplifier 300, the first signal is transmitted to the first transceiver 210 through the first modem 181.

Next, the operation of simultaneously transmitting the LTE and 5G signals (LTE+5G) has the following characteristics.

With respect to the LTE signal transmission, the LTE signal may be transmitted from the first transceiver 210, namely, the LTE transceiver to an output (out) of the second port (e.g., B71 TX_Dual) through internal switching. Alternatively, the LTE signal may be to an output (out) of the second port (for example, B71 TX_Dual) by changing to another internal modulator within the first transceiver 210, i.e., the LTE transceiver. On the other hand, the transmission is carried out through a 5G TX modulator in the second transceiver 220, that is, the 5G transceiver.

Regarding the transmission of the LTE signal and the 5G signal (LTE+5G), the signals are combined at the second power amplifier 400, namely, an LTE+5G PA input end, amplified and then transmitted. To this end, the LTE+5G signal combination is carried out by the power combiner 450 which combines signals of the two systems. On the other hand, the distributor 610 that distributes (divides, splits) a combined signal may divide the LTE/5G signal at a specific distribution ratio. The power combiner 450 and the distributor 610 may be configured as a microstrip line or the like, and may be implemented as a lumped element such as a separate inductor/capacitor. Also, the power combiner 450 and the distributor 610 may be provided with a lumped element such as a resister arranged at a specific position between ports for improving port-to-port isolation.

Meanwhile, with respect to one or more PAs that amplify signals of two systems, the power supply unit thereof may be an LTE modem processing unit or a 5G modem processing unit corresponding to the first modem 181 or the second modem 182. Alternatively, with regard to the one or more PAs, the power supply unit thereof may be the modem 180 or the LTE modem processing unit and the 5G modem processing unit. Alternatively, such power supply unit and a power supply control can be achieved through processing by a plurality of radio integrated modems such as LTE+5G+ other modems.

On the other hand, the power supply unit of the PA, that is, a power source device for amplification may be implemented as any of a device that supplies a fixed voltage, a device that adjusts a voltage variably, and the like. Further, any power supply unit or device can be controlled in various manners, and controlled by an individual modem or one modem. Also, the input/output matching control and the output power control for the PA may be carried out in the aforementioned manner or similar manners.

Figure 3:
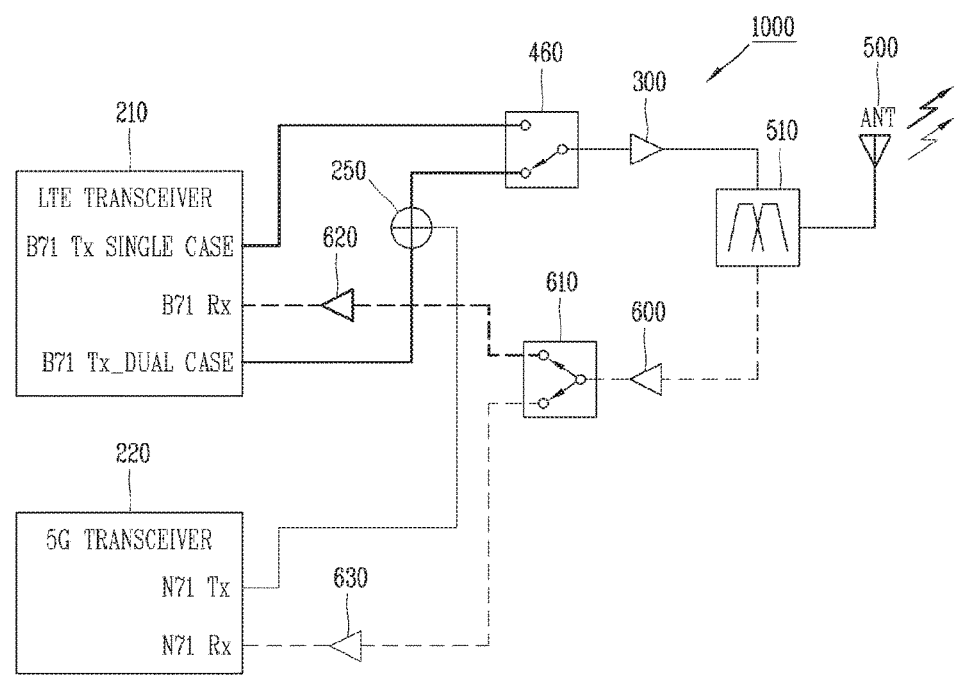
FIG. 3 is a view illustrating a transceiver having a single power amplifier and a mobile terminal having the transceiver according to another embodiment of the present invention.

On the other hand, if the number of power amplifiers is reduced, it is possible to reduce power consumption by the power amplifiers and simplify a control circuit. In this regard, FIG. 3 illustrates a transceiver having a single power amplifier and a mobile terminal having the transceiver according to another embodiment of the present invention. Referring to FIG. 3, the mobile terminal 1000 includes a first transceiver 210, a second transceiver 220, a power combiner 250, a power amplifier (PA) 300, and a switch 460. The mobile terminal 1000 may further include a modem 180, an antenna 500, a duplexer 510, a low-noise amplifier (LNA) 600, a distributor 610, a second low-noise amplifier 620, and a third low-noise amplifier 630.

The first transceiver 210 operates in a first communication system and provides a first signal or a second signal to the power amplifier 300. The second transceiver 220 operates in a second communication system and provides a third signal to the power amplifier 300. At this time, the first communication system may be the LTE system, and the second communication system may be the 5G communication system. The detailed description thereof will be replaced by the description in FIG. 2.

The power combiner 250 is configured to output a fourth signal by combining the second signal and the third signal of the first and second signals of the first transceiver 210 and the third signal of the second transceiver 220. On the other hand, an output of the power combiner 250 configured to combine the second signal of the first communication system with the third signal of the second communication system may be coupled to the switch 460. At this time, the output of the power combiner 250 may be connected to one switch port of two switch ports of the switch 460.

At this time, the switch 460 is configured to select one of the first signal and the fourth signal. In this regard, the power amplifier 300 is configured to amplify and output a first transmission signal or a second transmission signal selected by the switch 460. Here, the first transmission signal and the second transmission signal may be the first signal and the fourth signal selected by the switch 460, respectively. That is, the first transmission signal is the first signal of the first transceiver 210 and the second transmission signal is the fourth signal, which is the combined signal of the second signal of the first transceiver 210 and the third signal of the second transceiver 220.

The power amplifier 300 is configured to amplify and output at least one of the first to third signals. Specifically, the power amplifier 310 is configured to amplify and output one of (a) the first signal, and (b) the fourth signal as the combined signal of the second signal and the third signal.

On the other hand, with respect to the aforementioned DC (or DC release) operation, the operation of the modem 180 may be performed as described in FIG. 2.

Also, with regard to an operation at a receiving unit, as described with reference to FIG. 2, the low-noise amplifier (LNA) 600, the distributor 610, and the second and third low-noise amplifiers 620 and 630 are controlled by the first and second transceivers 100 and 200 or the modem 180.

The embodiment illustrated in FIG. 3 is implemented such that a single PA is configured without configuring a separate PA even when a path is changed by switching by the switch 460.

In the case of implementing the single PA, the signal transmission is made toward an output of the single PA, which corresponds to the first port, namely, the TX single, of the first transceiver 210, i.e., the LTE transceiver by the switching operation performed when only the LTE signal is transmitted. At this time, the PA, the power supply unit of the PA and the control thereof may be understood by the foregoing description. However, unlike FIG. 2, since the single PA is configured, a power supply control and an output power control are preferably performed by the first modem 100, that is, the LTE modem in order to improve control convenience.

Figure 4:
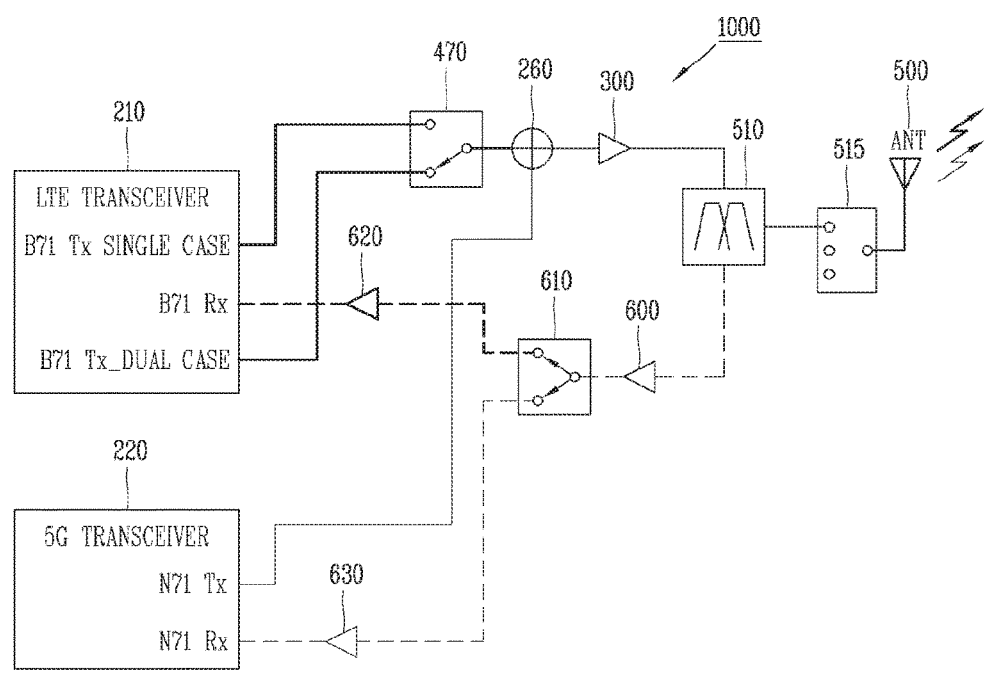
FIG. 4 is a view illustrating a transceiver having a single power amplifier and a mobile terminal having the transceiver according to another embodiment of the present invention.

On the other hand, it is possible to change an arrangement design of a power combiner and a transmission switch while using a single power amplifier. In this regard, FIG. 4 illustrates a transceiver having a single power amplifier and a mobile terminal having the same according to another embodiment of the present invention. Referring to FIG. 4, the mobile terminal 1000 includes a first transceiver 210, a second transceiver 220, a power combiner 260, a power amplifier (PA) 300, and a switch 470. The mobile terminal 1000 may further include a controller 180, an antenna 500, a duplexer 510, a low-noise amplifier (LNA) 600, a distributor 610, a second low-noise amplifier 620, and a third low-noise amplifier 630.

The first transceiver 210 operates in a first communication system and provides a first signal or a second signal to the power amplifier 300. The second transceiver 220 operates in a second communication system and provides a third signal to the power amplifier 300. At this time, the first communication system may be the LTE system and the second communication system may be the 5G communication system. The detailed description thereof will be replaced by the description in FIG. 2.

The power combiner 260 combines one of the first signal and the second signal with the third signal among the first and second signals of the first transceiver 210 and the third signal of the second transceiver 220. Meanwhile, an input of the power combiner 260 configured to combine the one of the first signal and the second signal of the first communication system with the third signal of the second communication system may be connected to the switch 470. At this time, the input of the power combiner 260 may be connected to one of two switch ports corresponding to outputs of the switch 470.

At this time, the switch 470 is configured to select either the first signal or the second signal. In this regard, the power amplifier 300 is configured to output a first transmission signal of the first communication system and the second transmission signal of the second communication system. Here, the first transmission signal and the second transmission signal may be signals combined by the power combiner 260. That is, the first transmission signal is the first signal or the second signal of the first transceiver 210, and the second transmission signal is the third signal of the second transceiver 220.

The power amplifier 300 is configured to amplify and output at least one of the first to third signals. Specifically, the power amplifier 310 is configured to amplify and output one of (a) the first signal or the second signal, and (b) the third signal. Alternatively, the power amplifier 310 may be configured to amplify and output all of the first to third signals.

As described above, the switch 470 is configured to select one of the first signal and the second signal of the first communication system from the first transceiver 210. The first communication system needs to be supported in any case and this is a scheme that the signal of the first communication system is directly selected at an output end of the first transceiver 210. Therefore, the first modem 181 can selectively transmit a signal having good signal quality out of the first signal and the second signal of the first communication system.

On the other hand, the embodiment of FIG. 4 has the advantage that the second communication system signal can be always combined by the power combiner 260.

On the other hand, with respect to the aforementioned DC (or DC release) operation, the operation of the modem 180 may be performed as described in FIG. 2.

Also, with regard to the operation at the receiving unit, as described with reference to FIG. 2, the control operations of the low-noise amplifier (LNA) 600, the distributor 610, and the second and third low-noise amplifiers 620 and 630 are performed by the first and second transceivers 100 and 200 or the modem 180.

The embodiment illustrated in FIG. 4 is implemented such that a single PA is configured without configuring a separate PA even when a path is changed by switching by the switch 470.

In the case where the single PA is configured, the signal transmission is carried out toward an output of a first port, i.e., a TX signal or a second port, i.e., a TX dual of the first transceiver 210, i.e., the LTE transceiver by the switching operation performed when only the LTE signal is transmitted. At this time, the PA, the power supply unit of the PA and the control thereof may be understood by the foregoing description. However, unlike FIG. 2, since the single PA is configured, a power supply control and an output power control are preferably performed by the first modem 100, that is, the LTE modem in order to improve control convenience.

Hereinafter, a switch 515 connectable to the antenna 500 in FIG. 4 will be described. Such a switch 515 performs a path dividing operation between the antenna 500 and a front end (RF transceiver), and thus may be referred to as a path dividing switch or an antenna switch 515. Meanwhile, the antenna switch 515 may operate only in a TDD mode, and may be replaced with the duplexer 510 in an FDD mode. Also, it is possible to use both the duplexer 510 and the antenna switch 515 depending on an application, as in the case of supporting both the TDD mode and the FDD mode.

The antenna switch 515 may be implemented through one or a plurality of controls. Regarding this control of the antenna switch 515, LTE modem processing or 5G modem processing by the first modem 181 or the second modem 182 may be carried out. Alternatively, the LTE modem processing and 5G modem processing may be performed by the modem 180 in the form of an integrated modem. Alternatively, the control of the antenna switch 515 may be performed through a plurality of radio integrated modem processing such as LTE+5G+other modems.

Figure 5:
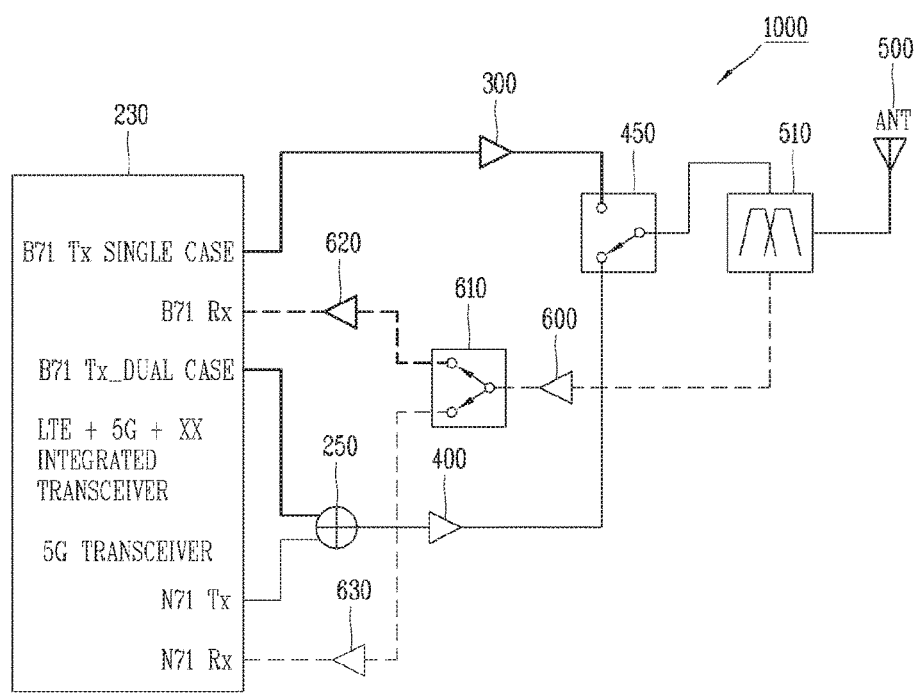
FIG. 5 is a view illustrating a detailed configuration of a mobile terminal having an integrated transceiver according to one embodiment of the present invention.

Meanwhile, the first and second transceivers 210 and 220 may be provided in the form of an integrated transceiver. In this regard, FIG. 5 illustrates a detailed configuration of a mobile terminal having an integrated transceiver according to one embodiment of the present invention. Also, FIG. 6 illustrates a detailed configuration of a mobile terminal having an integrated transceiver according to one embodiment of the present invention.

FIG. 5 illustrates that the first and second transceivers 210 and 220 are replaced by an integrated transceiver 230 in the structure of FIG. 2. In addition, FIG. 6 illustrates that the first and second transceivers 210 and 220 are replaced by an integrated transceiver 230 in the structure of FIG. 4. On the other hand, the structure illustrated in FIG. 2 is a structure including a dual power amplifier, namely, the first and second power amplifiers 300 and 400. On the other hand, the structure of FIG. 4 is a structure including a single power amplifier, that is, the power amplifier 300. FIG. 6 is not limited to the illustrated one but may be modified in various ways depending on an application. For example, FIG. 6 may be implemented such that the first and second transceivers 210 and 220 are replaced by an integrated transceiver 230 in the structure including the single power amplifier 300 of FIG. 3.

Figure 6:
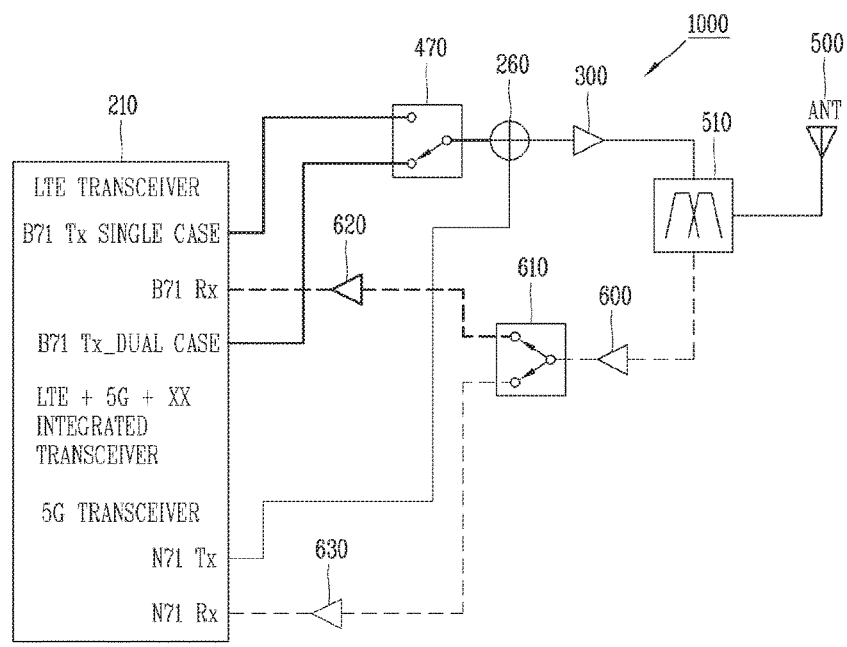
FIG. 6 is a view illustrating a detailed configuration of a mobile terminal having an integrated transceiver according to one embodiment of the present invention.

On the other hand, referring to FIGS. 5 and 6, the first transceiver 210 operating in the first communication system and the second transceiver 220 operating in the second communication system may be configured as an integrated transceiver 230. At this time, the integrated transceiver 230 may include a first transmission port, a second transmission port and a reception port of the first communication system, and a transmission port and a reception port of the second communication system. Here, the first transmission port, the second transmission port and the reception port of the first communication system (LTE system) may be (B71) TX single, (B71) TX Dual output port and (B71) RX input port, respectively. In addition, the transmission port and the reception port of the second communication system may be (n71) TX output port and (n71) RX input port.

The integrated transceiver 230 of FIGS. 5 and 6 may be summarized as follows. The transceiver may be implemented as the separate transceivers, such as the first and second transceivers 210 and 220 as illustrated in FIGS. 2 to 4, but may be implemented as the integrated transceiver 230 integrated into one device as illustrated in FIGS. 5 and 6. Even when implemented as the integrated transceiver 230, a signaling operation may be carried out in the same manner as the signaling operation described with reference to FIGS. 2 to 4. In order to carry out the same signaling operation by such a single transceiver, the integrated transceiver 230 needs to be divided into separate transmission ends. That is, the integrated transceiver 230 should be physically integrated but functionally separated.

Figure 7:
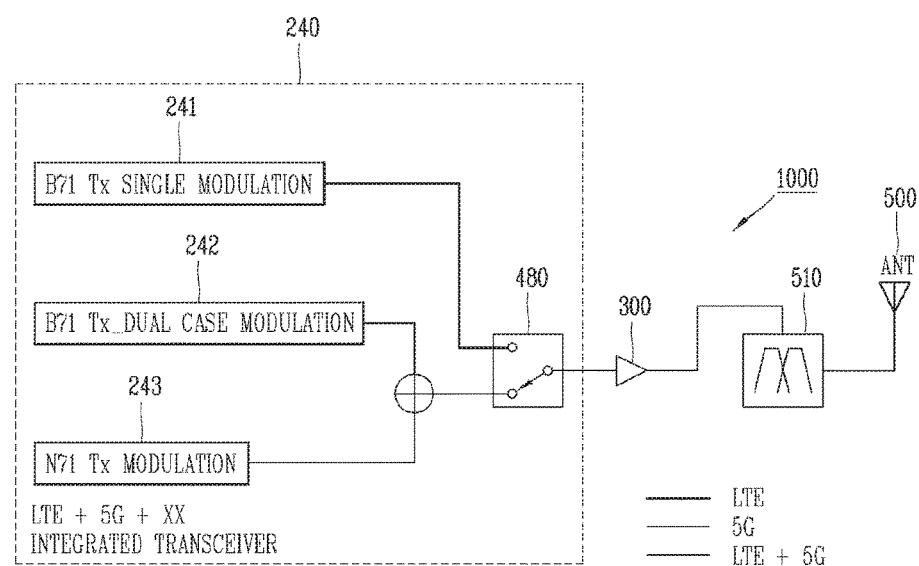
FIG. 7 is a view illustrating a detailed structure of an integrated transceiver according to another embodiment of the present invention.

Next, FIG. 7 illustrates a detailed structure of an integrated transceiver according to another embodiment of the present invention. Referring to FIG. 7, a first transceiver operating in a first communication system and a second transceiver operating in a second communication system may be configured as an integrated transceiver 240. At this time, a switch 480 is disposed in the integrated transceiver 240, and the integrated transceiver 240 is interfaced with the power amplifier 300 through one port.

The integrated transceiver 240 may also include respective modulators as well as the switch 480 to perform modem functions. The integrated transceiver 240 includes a first modulator 241 for modulating the first signal of the first communication system, and a second modulator 242 for modulating the second signal of the first communication system. The integrated transceiver 240 further includes a third modulator 243 for modulating the third signal of the second communication system. Here, the first and second communication systems are the LTE system and the 5G system, respectively. Specifically, the first and second modulators 241 and 242 may be (B71) TX single and dual modulators, respectively. Also, the third modulator 243 may be a (n71) TX modulator.

The integrated transceiver 240 in FIG. 7 is summarized as follows. A switching operation is performed by the switch 480 within the integrated transceiver 240. In addition, a device, namely, the power combiner 270 for combining (merging) signals of two different communication systems is configured within the integrated transceiver 240.

Thus, as the power combiner 270 and the switch 480 are disposed within the integrated transceiver 240, the power amplifier 300 is provided in the form of a single PA. However, the power supply unit of the power amplifier 300 may be provided by one or in plurality.

On the other hand, the control operation such as the output power control of the power amplifier 300 may be performed through LTE modem processing or 5G modem processing. Alternatively, the control operation such as the output power control of the power amplifier 300 may be performed through the LTE modem processing and the 5G modem processing. Alternatively, the control operation such as the output power control of the power amplifier 300 may be performed through a plurality of radio integrated modem processing such as LTE+5G+other modems.

The foregoing description has been given of the selective transmission scheme in the transmitting unit and the operation in the receiving unit through the single antenna. Hereinafter, the operation of the receiving unit according to a plurality of receiving units considering multiple input/output will be discussed. At this time, a plurality of antennas and low-noise amplifiers may be considered together with a plurality of receiving units.

Figure 8:
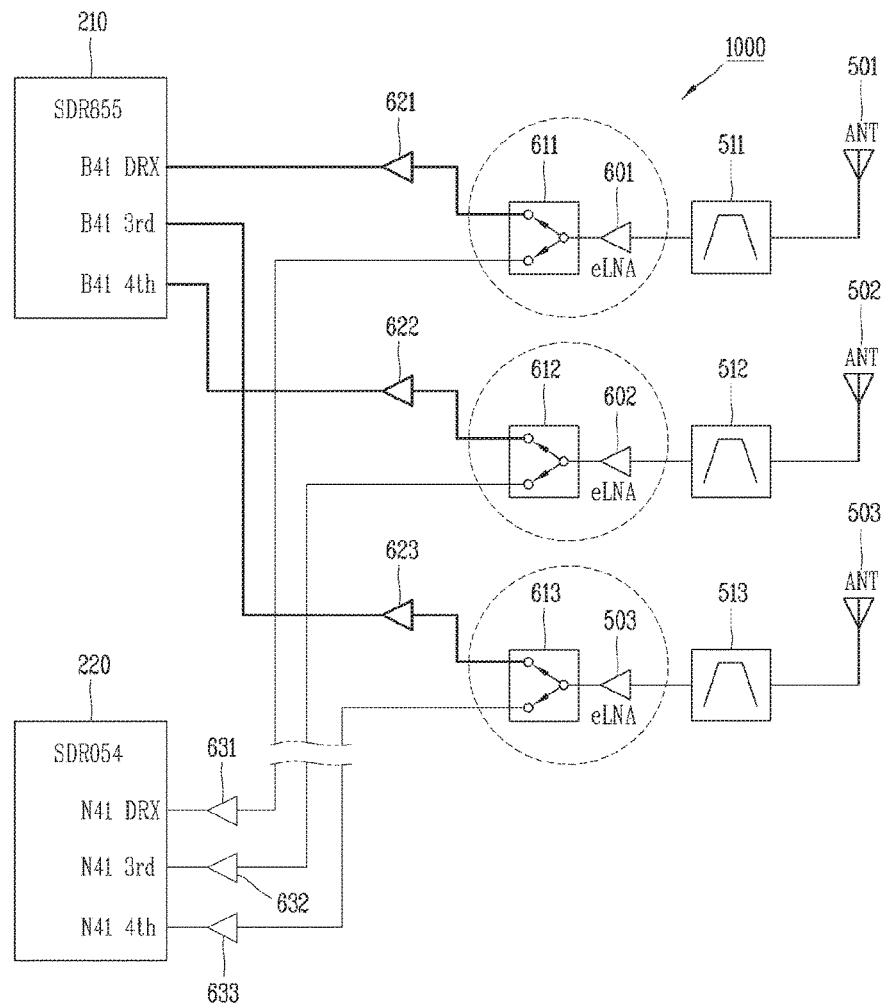
FIG. 8 is a view illustrating a detailed configuration of a mobile terminal having a plurality of receiving units according to one embodiment of the present invention.
Figure 8:

In this regard, FIG. 8 illustrates a detailed configuration of a mobile terminal having a plurality of receiving units according to one embodiment of the present invention. Referring to FIG. 8, the mobile terminal 100 includes a first transceiver 210, a second transceiver 220, first to third antennas 501 to 503, first to third duplexers 511 to 513, first to third low-noise amplifiers 601 to 603, and first to third distributors 611 to 613. Here, the first to third low-noise amplifiers 601 to 603 are disposed outside the first and second transceivers 210 and 220 and a modem (not shown), and may be referred to as an external LNA (eLNA).

In addition, the mobile terminal 100 further includes first to sixth receiving amplifiers 621 to 623 and 631 to 633. Meanwhile, the structure having the plurality of receiving units in FIG. 8 can be configured independently of the RF transmitting unit, but may alternatively be configured in combination of the RF transmitting unit and the transceiver. That is, the structure having the plurality of receiving units in FIG. 8 may be combined with the RF transmitting unit of FIGS. 2 to 4 or combined with the integrated transceiver of FIGS. 5 to 7.

Meanwhile, first to third components described above are examples of the case where the first to third receiving units are provided. Therefore, it can be freely extended/changed according to 2, 3, 4 and more receiving units depending on the application. However, for convenience of explanation, the mobile terminal having two or three receiving units and a control method thereof will be described below.

Referring to FIG. 8, the first low-noise amplifier 601 is configured to low-noise-amplify a first reception signal of the first communication system and a second reception signal of the second communication system. Meanwhile, the second low-noise amplifier 602 is configured to low-noise-amplify a third reception signal of the second communication system and a fourth reception signal of the second communication system. In addition, the third low-noise amplifier 603 is configured to low-noise-amplify a fifth reception signal of the second communication system and a sixth reception signal of the second communication system.

The first distributor 611 is connected to the first low-noise amplifier 601 and distributes the amplified first or second reception signal to an input of the first transceiver 210 and an input of the second transceiver 220. The second distributor 612 is connected to the second low-noise amplifier 602 and distributes the amplified third or fourth reception signal to the input of the first transceiver 210 and the input of the second transceiver 220. The third distributor 613 is connected to the third low-noise amplifier 603 and distributes the amplified fifth or sixth reception signal to the input of the first transceiver 210 and the input of the second transceiver 220.

Although the first to third distributors 611 to 613 described above are shown in the form of a switch, they are not limited to the switches but may be referred to as a divider or a splitter. In other words, those distributors are configured as a DPDT type switch other than a SPDT type switch so that outputs by the low-noise amplifiers are simultaneously provided to the receiving amplifiers.

Hereinafter, description will be given of operations of the first to sixth receiving amplifiers 621 to 623 and 631 to 633, which are connected to the outputs of the first to third distributors 611 to 613 and additionally amplify the signals of the first and second communication systems, respectively.

The first receiving amplifier 621 is configured to amplify a signal distributed from the first distributor 611 and output the amplified signal to the first transceiver 210. The second receiving amplifier 631 is configured to amplify the signal distributed from the first distributor 611 and output the amplified signal to the second transceiver 220.

Meanwhile, the third receiving amplifier 622 is configured to amplify the signal distributed from the second distributor 612 and output the amplified signal to the first transceiver 210. The fourth receiving amplifier 632 is configured to amplify the signal distributed from the second distributor 612 and output the amplified signal to the second transceiver 220.

The fifth receiving amplifier 623 is configured to amplify the signal distributed from the third distributor 613 and output the amplified signal to the first transceiver 210. The sixth receiving amplifier 633 is configured to amplify the signal distributed from the third distributor 613 and output the amplified signal to the second transceiver 220.

On the other hand, a carrier aggregation (CA) may be performed using the plurality of receiving units. Further, different types of time-based controls may be carried out using the different first and second communication systems.

In this regard, the first distributor 611 simultaneously provides a first reception signal and a second reception signal of a first frequency band to the first receiving amplifier 621 and the second receiving amplifier 631, respectively. Meanwhile, the second distributor 612 simultaneously provides a third reception signal and a fourth reception signal of a second frequency band to the third receiving amplifier 622 and the fourth receiving amplifier 632, respectively. The third distributor 613 may simultaneously provide a fifth reception signal and a sixth reception signal of a third frequency band to the fifth receiving amplifier 623 and the sixth receiving amplifier 633, respectively.

Accordingly, an intra-carrier aggregation (CA) may be performed through the first frequency band and the second frequency band. That is, first information and third information of the LTE system are simultaneously provided to the mobile terminal 100 through an intra CA using the first reception signal of the first frequency band and the third reception signal of the second frequency band.

Also, first information and third information of the 5G system are simultaneously provided to the mobile terminal 100 through an intra-CA using the second reception signal of the first frequency band and the fourth reception signal of the second frequency band. Also, an intra CA through first to third frequency bands can be carried out.

Alternatively, an inter CA of the LTE and 5G systems (LTE+5G) may be carried out. With respect to the inter CA, the first frequency band may be divided so that some are allocated to the LTE system and some to the 5G system. At this time, frequency bands of the LTE/5G system may be adjacent within the first frequency band. Alternatively, the frequency bands of the LTE/5G system may be at least partially overlapped within the first frequency band. In this case, the frequency bands of the LTE/5G system in the first frequency band may be referred to as a first LTE frequency band and a first 5G frequency band, respectively.

Accordingly, the first information of the LTE system and the second information of the 5G system are simultaneously provided to the mobile terminal 100 through the first reception signal of the first LTE frequency band and the inter-CA of the first 5G frequency band. Also, an inter-CA through first to third frequency bands may be carried out.

At this time, the LTE/5G system may perform a control information exchange and a control operation in different ways. In this regard, in the LTE system, the control information exchange and the control operation may be performed on a sub-frame basis. On the other hand, in the 5G system, the control information exchange and the control operation may be performed on a slot basis through low latency communication.

Accordingly, the first information and the third information included in the first reception signal and the third reception signal of the LTE system may include first control information for each sub frame. On the other hand, the third information and the fourth information included in the second and fourth reception signals of the 5G system may include second control information for each slot.

Meanwhile, in the case of an intra-CA between LTE systems, the first information and the third information included in the first and third reception signals may include first control information only in a first sub frame associated with the first reception signal. In the case of an intra-CA between 5G systems, the first information and the third information included in the second and fourth reception signals may include the first control information only in a first slot associated with the second reception signal. Therefore, in the cases of the intra-CAs, the control information is included only in the first sub frame or the first slot, so that a throughput can be improved. Hereinafter, an operation of a transmitting unit in a control information receiving section will be described with reference to FIGS. 2 to 4.

Referring to FIGS. 2 and 8, an LTE power transmission by the first power amplifier 300 may not be carried out in a time interval including the first control information of the LTE system. Alternatively, the switch 450 may be configured to be connected to the second power amplifier 400 such that the LTE signal transmission is minimized in the time interval including the first control information of the LTE system. At this time, the LTE+5G signal transmission mode may be a low power mode.

On the other hand, referring to FIGS. 2 and 8, a 5G power transmission by the second power amplifier 400 may not be carried out in a time interval including the second control information of the 5G system. To this end, the switch 450 may be configured to be coupled to the first power amplifier 300.

On the other hand, not only carrier aggregation (CA) but also multiple input/output (MIMO) operations may be performed using a plurality of antennas.

In this regard, the first low-noise amplifier 601 is connected to the first antenna 501 through the first duplexer 511 and the second low-noise amplifier 602 is connected to the second antenna 502 through the second duplexer 512. Also, the third low-noise amplifier 603 may be connected to the third antenna 503 through the second duplexer 513.

At this time, the first antenna 501 simultaneously receives the first reception signal and the second reception signal of the first frequency band, and the second antenna 502 simultaneously receives the third reception signal and the fourth reception signal of the second frequency band. Also, the third antenna 503 may simultaneously receive the fifth and sixth reception signals of the third frequency band. Here, the first, third, and fifth reception signals may be LTE signals, and the second, fourth, and sixth reception signals may be 5G signals.

At this time, the first transceiver 210 and the second transceiver 220 may simultaneously acquire the first to fourth information included in the first to fourth reception signals. Alternatively, the first transceiver 210 and the second transceiver 220 may simultaneously acquire first to sixth information included in the first to sixth reception signals.

In this regard, the LTE signals of the different frequency bands received through the first to third antennas 501 to 503 may be subjected to an intra-CA by the first modem 181 of FIG. 2. On the other hand, the 5G signals of the different frequency bands received through the first to third antennas 501 to 503 may be subjected to an intra-CA by the second modem 181 of FIG. 4.

Alternatively, the first antenna 501 simultaneously receives the first and second reception signals of the first frequency band, and the second antenna 502 simultaneously receives the third and fourth reception signals of the first frequency band. In addition, the third antenna 503 may simultaneously receive the fifth and sixth reception signals of the first frequency band.

At this time, the first transceiver 210 and the second transceiver 220 may simultaneously acquire the first to fourth information included in the first to fourth reception signals. Alternatively, the first transceiver 210 and the second transceiver 220 may simultaneously acquire first to sixth information included in the first to sixth reception signals.

In this regard, the LTE signals of the same frequency band received through the first to third antennas 501 to 503 may be subjected to MIMO signal processing by the first modem 181 of FIG. 2. On the other hand, the 5G signals of the different frequency bands received through the first to third antennas 501 to 503 may be subjected to MIMO signal processing by the second modem 181 of FIG. 4.

The contents of FIGS. 2 to 7 mainly relate to the structure of the transmitting unit, but FIG. 8 relates to the structure of the receiving unit in a reception band. That is, as illustrated in FIG. 8, one receiving unit (end) is constituted by an eLNA and an element, namely, a distributor for distributing the output of the rear end. Accordingly, each of the plurality of receiving units can receive the LTE/5G signals to transmit to the first and second transceivers 210 and 220 or the first and second modems.

As illustrated in (b) of FIG. 8, a signal for turning on/off an eLNA corresponding to the first to third low-noise amplifiers 601 to 603 may be implemented in a structure capable of turning on/off both two systems through an OR gate.

The foregoing description has been given of the multiple transmit system structure, a mobile terminal having the structure, and a control method thereof according to the present invention. Technical effects of the transceiver having a single/dual amplifier, the mobile terminal having the transceiver, and the control method of the mobile terminal will be described below.

According to at least one embodiment of the present invention, a mobile terminal having a transmitting unit capable of selectively transmitting a signal of a second communication system while transmitting a signal of a first communication system can be provided, thereby improving transmission output characteristics.

Also, according to at least one embodiment of the present invention, a mobile terminal having improved transmission output power characteristics can be provided by providing a transmitting unit employing a 5G signal transmission scheme as well as an LTE signal transmission scheme in an LTE re-farming system.

In addition, according to at least one embodiment of the present invention, a mobile terminal having improved low-noise characteristics can be provided by employing a receiving unit supporting a 5G signal receiving scheme as well as an LTE signal receiving scheme in an LTE re-farming system.

Further, according to at least one of the embodiments of the present invention, an LTE/5G communication service can be provided by receiving an LTE/5G signal through a single receiving unit, and communication services in the LTE/5G system or between those systems can be flexibly provided through a plurality of receiving units.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the aforementioned present invention, design and operations of a transmitting unit including a power amplifier and a transceiver and a receiving unit including a low-noise amplifier can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

What is claimed is:

1. A mobile terminal comprising:
   a first transceiver configured to operate according to a first communication system;
   a second transceiver configured to operate according to a second communication system;
   a first power amplifier configured to amplify and output a first signal output by the first transceiver;
   a power combiner configured to combine a second signal output by the first transceiver with a third signal output by the second transceiver to output a fourth combined signal;
   a second power amplifier configured to amplify and output the fourth combined signal output by the power combiner; and
   a switch configured to selectively allow transmission of a first transmission signal of the amplified first signal output by the first power amplifier or a second transmission signal of the amplified fourth combined signal output by the second power amplifier.

2. The mobile terminal of claim 1, wherein the first communication system is a Long-Term Evolution (LTE) system, the second communication system is a Fifth Generation (5G) communication system, and a frequency band of the first communication system is the same as a frequency band of the second communication system.

3. The mobile terminal of claim 1, further comprising a single antenna operably coupled to the switch and configured to transmit a transmission signal as the first transmission signal or the second transmission signal to a base station or another mobile terminal based on operation of the switch.

4. The mobile terminal of claim 3, further comprising a duplexer disposed between the switch and the single antenna and configured to separate the transmission signal from a reception signal received from the base station or the another mobile terminal via the single antenna,
   wherein the duplexer is operably coupled to the switch via a transmission path and operably coupled to a first low-noise amplifier via a reception path, and
   wherein the first low-noise amplifier is configured to amplify a first reception signal of the first communication system and a second reception signal of the second communication system.

5. The mobile terminal of claim 4, further comprising:
   a distributor operably coupled to the low-noise amplifier and configured to distribute the amplified first reception signal or second reception signal as an input to the first transceiver and an input of the second transceiver;
   a second low-noise amplifier disposed along a first reception path between the distributor and the first transceiver to amplify a distributed first reception path signal; and
   a third low-noise amplifier disposed along a second reception path between the distributor and the second transceiver to amplify a distributed second reception path signal.

6. The mobile terminal of claim 1, wherein when the switch is connected to an output of the first power amplifier, the switch connection is synchronized such that the first signal of the first transceiver is selected, and wherein when the switch is connected to an output of the second power amplifier, the switch connection is synchronized such that the second signal of the first transceiver is selected.

7. The mobile terminal of claim 1, wherein:
   the first signal is output by the first transceiver through a first port of the first transceiver; and
   the second signal is output by the first transceiver through a second port of the first transceiver when the first transceiver and the second transceiver simultaneously output the second signal and the third signal;
   the first transceiver further comprises a first modulator, a plurality of second modulators, and a switch, and
   the first modulator operates to output the first signal through the first port and the plurality of second modulators operate to output the second signal through the second port, and the switch is configured to selectively allow signal output from the first port or the second port.

8. The mobile terminal of claim 1, further comprising a first modem operably coupled to the first transceiver and a second modem operably coupled to the second transceiver, wherein:
   the first modem is configured to control power supply to the first power amplifier; and
   the first modem and the second modem are configured to control power supply to the second power amplifier.

9. The mobile terminal of claim 1, further comprising a controller configured to control operation of the first transceiver and the second transceiver,
   wherein the controller is configured to control both the first transceiver and the second transceiver to operate and control the switch to selectively allow transmission of the second transmission signal when a reference signal of the first communication system is less than a threshold value.

10. The mobile terminal of claim 1, further comprising a controller configured to control operation of the first transceiver and the second transceiver,
    wherein the controller is configured to control the first transceiver to operate and the second transceiver not to operate and control the switch to selectively allow transmission of the first transmission signal when a first reference signal of the first communication system is more than a first threshold value and a second reference signal of the second communication system is less than a second threshold value.

11. The mobile terminal of claim 1, further comprising a controller configured to control operation of the first transceiver and the second transceiver,
    wherein the controller is configured to control both the first transceiver and the second transceiver to operate and control the switch to selectively allow transmission of the second transmission signal when a reference signal received by the first transceiver through the second low-noise amplifier is more than a threshold value, and
    wherein the controller is configured to control the first transceiver to operate and the second transceiver not to operate and control the switch to selectively allow transmission of the first transmission signal when a first reference signal received by the first transceiver through the second low-noise amplifier is more than a first threshold value and a second reference signal received by the second transceiver through the third low-noise amplifier is less than a second threshold value.

12. The mobile terminal of claim 1, further comprising a controller configured to control operation of the first transceiver and the second transceiver, wherein the controller is configured to retransmit a first request using the first communication system and the second communication system when the first request is transmitted using the first communication system and a reception of a first response to the first request from a base station or another mobile terminal is unsuccessful, and wherein the first transceiver and the second transceiver are configured to both operate during a time interval including a time duration and a time margin for the retransmission, and the controller is configured to control the switch to selectively allow transmission of a second transmission signal on a second path.

13. A mobile terminal, comprising:

one or more transceivers configured to output a first signal and a second signal of a first part of the one or more transceivers and a third signal of a second part of the one or more transceivers;

a power combiner configured to output a fourth signal by combining the second signal with the third signal;

a switch configured to selectively allow transmission of one of the first signal or the fourth signal; and one power amplifier configured to amplify and output at least one of the first or fourth signal;

wherein the one or more transceivers is configured to operate in a first communication system and a second communication system.

14. The terminal of claim 13, wherein an output of the power combiner is provided to one of two switch ports of the switch.

15. The terminal of claim 13, wherein the one or more transceivers operating in the first communication system and the second communication system is configured as an integrated transceiver, and wherein the integrated transceiver comprises a first transmission port, a second transmission port and a reception port of the first communication system, and a transmission port and a reception port of the second communication system.

16. The terminal of claim 13, wherein the one or more transceivers operating in the first communication system and the second communication system are configured as an integrated transceiver, and wherein the switch is implemented within the integrated transceiver and the integrated transceiver is interfaced with the power amplifier through one port.

17. A mobile terminal, comprising:

one or more transceivers configured to output a first signal and a second signal of a first part of the one or more transceivers and a third signal of a second part of the one or more transceivers;

a switch configured to selectively allow transmission of the first signal or the second signal;

a power combiner configured to output a fourth signal by combining the first signal with the third signal or the second signal with the third signal based on operation of a switch; and one power amplifier to amplify and output the fourth signal;

wherein the one or more transceivers is configured to operate in a first communication system and a second communication system.

18. The mobile terminal of claim 17, wherein an output of the switch is provided to the power combiner.

19. The mobile terminal of claim 17, wherein the one or more transceivers operating in the first communication system and the second communication system is configured as an integrated transceiver, and wherein the integrated transceiver comprises a first transmission port, a second transmission port, and a reception port of the first communication system, and a transmission port and a reception port of the second communication system.

* * * * *